United States Patent
Khenkin et al.

(10) Patent No.: US 12,379,400 B2
(45) Date of Patent: Aug. 5, 2025

(54) SEGMENTED-WIDTH THIN-FILM SENSE RESISTORS WITH WIDTH-DISTRIBUTED TERMINAL LAND CONNECTIONS

(71) Applicant: CIRRUS LOGIC INTERNATIONAL SEMICONDUCTOR LTD., Edinburgh (GB)

(72) Inventors: Aleksey Khenkin, Lago Vista, TX (US); Michael J. Murphy, Statesville, NC (US)

(73) Assignee: CIRRUS LOGIC, INC., Austin, TX (US)

( * ) Notice: Subject to any disclaimer, the term of this patent is extended or adjusted under 35 U.S.C. 154(b) by 174 days.

(21) Appl. No.: 18/140,456

(22) Filed: Apr. 27, 2023

(65) Prior Publication Data

US 2024/0361356 A1 Oct. 31, 2024

(51) Int. Cl.
*G01R 1/20* (2006.01)
*G01R 19/00* (2006.01)

(52) U.S. Cl.
CPC ......... *G01R 1/203* (2013.01); *G01R 19/0092* (2013.01)

(58) Field of Classification Search
CPC ... H01L 27/0802; H01L 27/101; H01C 7/006; G01R 1/203; G01R 19/00–32; G01R 19/0092; G01R 19/0084; G01R 25/00–08; G01R 27/00–32
See application file for complete search history.

(56) References Cited

U.S. PATENT DOCUMENTS

| | | | |
|---|---|---|---|
| 7,208,388 B2 | 4/2007 | Beach et al. | |
| 7,449,783 B2 | 11/2008 | Beach et al. | |
| 10,727,192 B2 * | 7/2020 | Abraham | H01L 23/488 |
| 11,519,957 B2 | 12/2022 | Berge et al. | |
| 2014/0225220 A1 * | 8/2014 | Tamagawa | H10D 84/204 |
| 2020/0303094 A1 * | 9/2020 | Chintarlapalli Reddy | H01C 1/01 |
| 2021/0364560 A1 | 11/2021 | Holland et al. | |
| 2022/0384413 A1 | 12/2022 | Khenkin et al. | |

OTHER PUBLICATIONS

Tom Lee et al. Characterization and Reliability of TaN Thin Film Resistors, Jul. 26, 2004, IEEEXplore (Year: 2004).*

* cited by examiner

*Primary Examiner* — Lee E Rodak
*Assistant Examiner* — Jeremiah J Barron
(74) *Attorney, Agent, or Firm* — Mitch Harris, Atty at Law, LLC; Andrew M. Harris (57) ABSTRACT

A thin-film resistor circuit for an integrated circuit provides low resistance by segmenting a thin-film resistor to provide a wider effective thin-film resistor in a smaller die. The die includes a substrate, multiple electronic devices integrated on the substrate and interconnected to form at least a portion of an electronic circuit, a plurality of interconnect lands arranged in a grid that interconnect the devices with external terminals, and a thin-film resistor implemented by two or more thin-film resistor segments that operate in parallel in the circuit. The segments are disposed between different pairs of adjacent columns of the grid interconnect lands, with one of the thin-film resistor segments electrically connected along its width to lands of a first column of the grid of interconnect lands, and another one of the thin-film resistor segments is electrically connected along its width to lands of a second column of the grid interconnect lands.

20 Claims, 6 Drawing Sheets

SEGMENTED-WIDTH THIN-FILM SENSE RESISTORS WITH WIDTH-DISTRIBUTED TERMINAL LAND CONNECTIONS

FIELD OF DISCLOSURE

The field of representative embodiments of this disclosure relates to thin-film current sensors integrated in integrated circuits (ICs) in which current is measured by voltage-drop sensing using a thin-film resistor, such as power output drivers for motors or audio transducers, or in battery monitoring circuits.

BACKGROUND

Resistive sensors are found in current-sensing and voltage-sensing applications, for example in audio amplifiers, motor controllers and battery chargers/power management circuits, in which the output current is measured by including a series resistance in the output circuit, i.e., the circuit driving the particular load(s), e.g., speakers, motor windings, or batteries. In order to provide accurate results, the ambient temperature of the resistance must typically be known, as well as the temperature coefficient of the specific resistor, as resistive materials typically exhibit a wide degree of variation of resistivity with temperature. In such applications, when the sense resistors are integrated within an IC, thin-film resistors are typically formed by depositing a material with a low and stable temperature coefficient of resistance, such as tantalum nitride (TaN). However, TaN has a very high resistivity, which, in order to maintain circuit efficiency and reduce thermal dissipation, requires a very high width-to-length (W/L) ratio to produce a sense resistor with a sufficiently low resistance value.

Thin-film sense resistor circuits have been implemented with a very high W/L ratio, and in such thin-film resistor circuits, variation in terminal voltage across the width and consequent current density variation that leads to sensing error has been reduced by providing separate high-current terminals and voltage sensing terminals, and also by metallic paths that extend across the width of the thin-film resistor at each end. However, the width required for implementation of some thin-film sense resistors is prohibitive for integration on small dies, which may be only a few millimeters in length. Further, techniques have been developed for compensating for voltage variations across the width of such as resistor, such as the compensating resistor networks disclosed in U.S. Patent Application Publication US20210364560A1, the disclosure of which is incorporated herein by reference. When implementing such compensation networks for a very wide thin-film resistor, the ratio of resistances, and therefore the range of resistances required in the compensation network may dictate a resistance for the thin-film resistor itself that is undesirable.

Therefore, it would be advantageous to provide a wide thin-film resistor implementation that can be incorporated on smaller dies. It would also be desirable to provide a resistive compensation network that overcomes the requirement of a wide range of resistance in the compensation network.

SUMMARY

Incorporation of wide thin-film resistors in a small die area and with reduced range of compensating network resistances is provided in thin-film resistor circuits, ICs incorporating the thin-film resistor circuits, and methods of fabrication/operation of the thin-film resistor circuits.

A die that implements the ICs includes a substrate, multiple electronic devices integrated on the substrate and interconnected to form at least a portion of an electronic circuit, a plurality of interconnect lands arranged in a grid for interconnecting the electronic devices with a plurality of external terminals, and a thin-film resistor implemented by two or more thin-film resistor segments that operate in parallel in the electronic circuit. The thin-film resistor segments are disposed between different pairs of adjacent columns of the grid interconnect lands, with one of the thin-film resistor segments electrically connected along its width to lands of a first column of the grid of interconnect lands, and another one of the thin-film resistor segments is electrically connected along its width to lands of a second column of the grid interconnect lands. The lands connected to the resistor segments may then be shorted by metal connected to the grid interconnect lands to reduce voltage variation across the widths of the thin-film resistor segments.

The summary above is provided for brief explanation and does not restrict the scope of the claims. The description below sets forth example embodiments according to this disclosure. Further embodiments and implementations will be apparent to those having ordinary skill in the art. Persons having ordinary skill in the art will recognize that various equivalent techniques may be applied in lieu of, or in conjunction with, the embodiments discussed below, and all such equivalents are encompassed by the present disclosure.

DETAILED DESCRIPTION

The present disclosure encompasses electronic circuits and ICs that include thin-film resistors that may be segmented across their widths. The segments may be connected in parallel internal and/or external to an IC. A die that implements the ICs includes a substrate with multiple electronic devices integrated on the substrate and interconnected to form at least a portion of an electronic circuit. Multiple interconnect lands may be arranged in a grid for interconnecting the electronic devices with external terminals. The thin-film resistor may be implemented by two or more thin-film resistor segments that operate in parallel in the electronic circuit. The thin-film resistor segments may be disposed between different pairs of adjacent columns of the grid interconnect lands, with terminals of the thin-film resistor segments electrically connected along their widths to lands of corresponding columns. The lands connected to the resistor segments may then be shorted by metal connected to the grid interconnect lands to reduce voltage variation across the widths of the thin-film resistor segments.

Figure 1A:
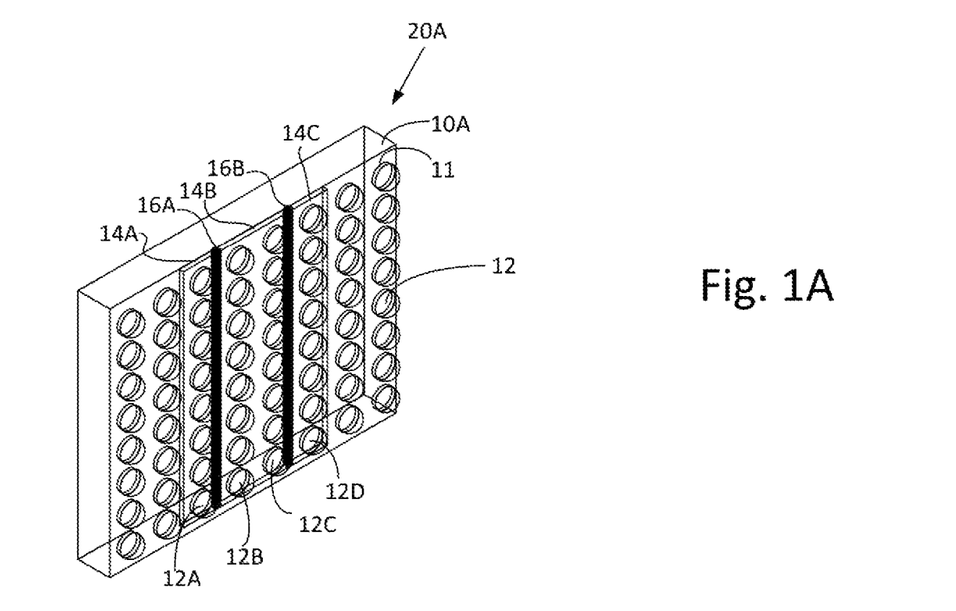
FIG. 1A is a perspective view of an integrated circuit 20A incorporating an example die 10A.
Figure 1B:
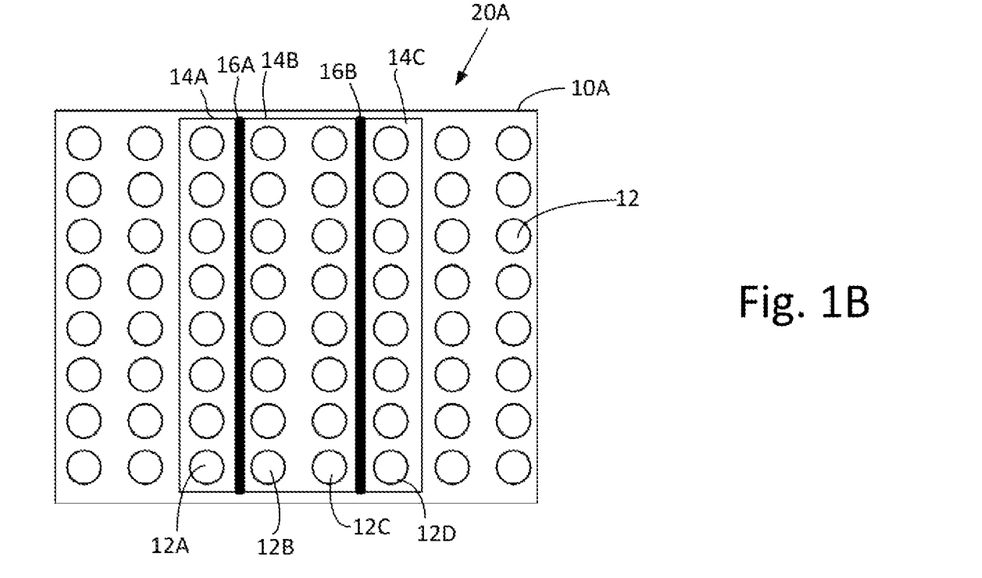
FIG. 1B is a bottom pictorial view depicting features of example IC 20A.
Figure 1C:
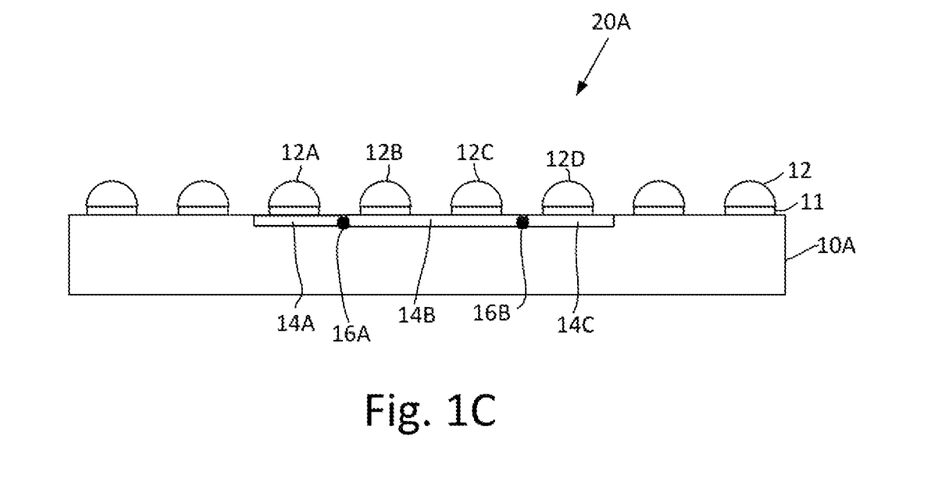
FIG. 1C is a side cross-section view of example IC 20A, in accordance with an embodiment of the disclosure.

Referring now to FIGS. 1A-1C, features of an example IC 20A are shown, according to an embodiment of the disclosure. While a ball-grid array (BGA) package is illustrated, it is understood that the techniques applied in the instant embodiment may be applied to other IC interconnect and package types in which a grid of interconnect terminals is implemented. FIG. 1A is a perspective view of IC 20A incorporating an example die 10A, which includes lands 11 for attaching solder balls 12 that form the electrical terminals of IC 20A. FIG. 1B is a bottom pictorial view depicting features of example IC 20A. Two thin-film resistor segments 16A and 16B are formed by depositing thin strips of a resistive material, such as tantalum nitride (TaN) or other suitable resistive material, to form thin-film resistor segments 16A and 16B. While the illustrated examples disclosed herein split thin-film resistors into a pair of segments, if additional area and any required terminal locations are available, the thin-film resistors may be further segmented into three or more segments, which may be connected in parallel with techniques as disclosed herein. The end terminals of resistor segments 16A and 16B are provided by conductive strips 14A, 14B, and 14C formed by a metal layer, and which are connected, either by direct deposition or vias, to lands 11 of corresponding columns of the grid.

In the illustrated embodiment, each of the thin-film resistor segments 16A and 16B is connected to two corresponding columns of the grid, with the center two columns both connected to a larger, two-column-wide conductive strip 14B, which maintains the same current level per terminal, e.g., columns of solder balls 12A, 12B, 12C and 12D should conduct the same current levels, although the current levels will generally vary along terminals of the columns of solder balls 12A, 12B, 12C and 12D, i.e., along the width of the thin-film resistor segments 16A, 16B and therefore along the width of the thin-film resistor formed by thin-film resistor segments 16A, 16B. In addition to conductive strips 14A, 14B, and 14C integrated in die 20A, or alternatively as to the continuous short provided across the columns of solder balls 12A, 12B, 12C and 12D, external conductors of the printed circuit board (PCB) to which integrated circuit 20A is mounted will generally be provided. The external conductors short the solder balls of each of the columns of solder balls 12A, 12B, 12C and 12D, both to further reduce current-density variation across the width of thin-film resistor segments 16A, 16B and to conduct heat away from thin-film resistor segments 16A, 16B. FIG. 1C is a side cross-section view of example IC 20A, which shows details of lands 11 that connect to conductive strips 14A-14C, and to which solder balls 12 are attached. FIG. 1C also illustrates the "length" of thin-film resistor segments 16A, 16B, which may be very short, e.g., much less than the diameter of lands 11, providing as low a length contribution to resistance as is practical for fabrication, while the extension of thin-film resistor segments 16A, 16B along the face of die 10A (in the direction of the page), as well as the parallel interconnection of thin-film resistor segments 16A, 16B, provides an increased effective width. Since the resistance of a resistive body is inversely proportional to the W/L ratio, the architecture of IC 20A provides an implementation of thin-film resistors that may have lower impedance than is possible for thin-film resistors without segmented width, in particular where the width of the thin-film resistor is limited by the dimensions of the die on which the thin-film resistor is integrated, or by the dimensions of an allocated die area to which the implementation is limited. Further, in implementations in which resistor segments 16A, 16B extend to the edges of the die, high-voltage connection terminals may be provided by solder balls at the edge, easing routing restrictions with respect to the high voltage terminals. Heat generated by thin-film sense resistor segments 16A, 16B is distributed symmetrically across the die, reducing mechanical stresses and device mis-match due to larger or non-uniform temperature gradients.

Figure 2A:
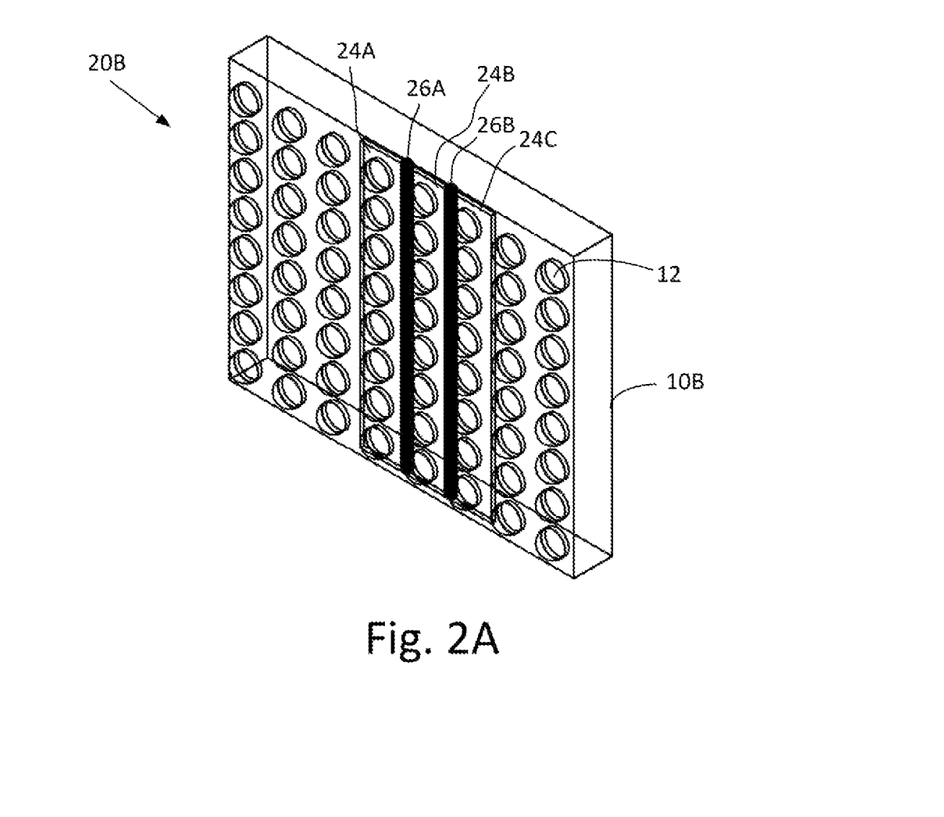
FIG. 2A is a perspective view of an integrated circuit 20B incorporating an example die 10B.
Figure 2B:
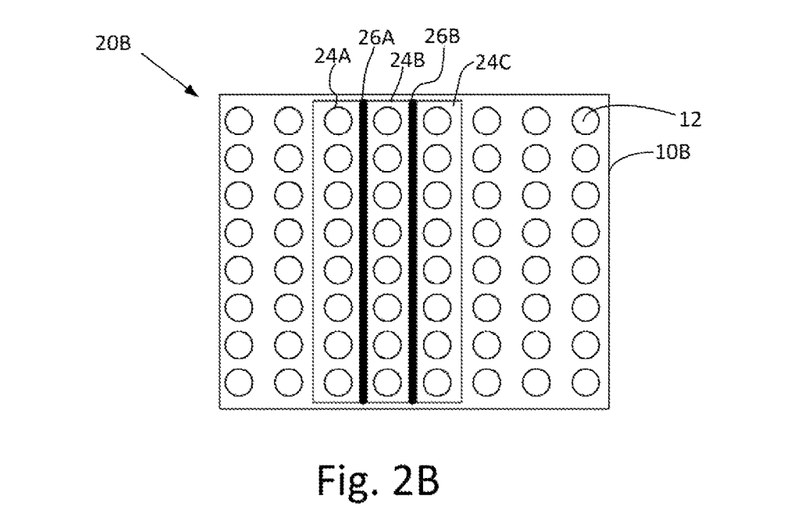
FIG. 2B is a bottom pictorial view depicting features of example IC 20B.
Figure 2C:
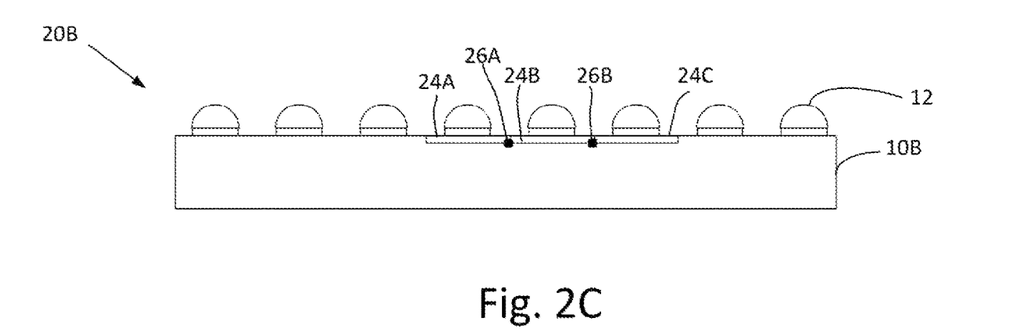
FIG. 2C is a side cross-section view of example IC 20B, in accordance with another embodiment of the disclosure.

Referring now to FIGS. 2A-2C, features of another example IC 20B are shown, according to another embodiment of the disclosure. While a ball-grid array (BGA) package is illustrated, it is understood that the techniques applied in the instant embodiment may be applied to other IC interconnect and package types in which a grid of interconnect terminals is implemented. Example IC 20B is similar in form and function to IC 20A as described above with reference to FIGS. 1A-1C, so only differences between IC 20B and IC 20A will be described below. FIG. 2A is a perspective view of IC 20B incorporating an example die 10B. FIG. 1B is a bottom pictorial view depicting features of example IC 20B. FIG. 2C is a side cross-section view of example IC 20B, which shows details of lands 11 that connect to three conductive strips 24A-24C, and to which solder balls 12 are attached. Two thin-film resistor segments 26A and 26B are formed between conductive strips 24A and 24B, and between conductive strips 24B and 24C, respectively. Conductive strips 24A-24C each only occupy single column width of the grid, and are connected to solder balls in their corresponding columns. Therefore, the layout of example IC 20B consumes a lesser number of terminals, i.e., solder balls 12, and the consequent die area/volume associated with conductive strips 24A-24C is reduced with respect to that of conductive strips 14A-14C in IC 20A of FIGS. 1A-1C. However, the current density across conductive strip 24B is double that of conductive strips 24A, 24C, and also doubled with respect to that in conductive strips 14A-14C in IC 20A of FIGS. 1A-1C. Therefore, the layout of IC 20B may be used when the current levels through the thin-film resistor do not exceed 50% of the total current-carrying capacity of the associated solder balls 12, lands 11 and conductive strip 24B.

Figure 3:
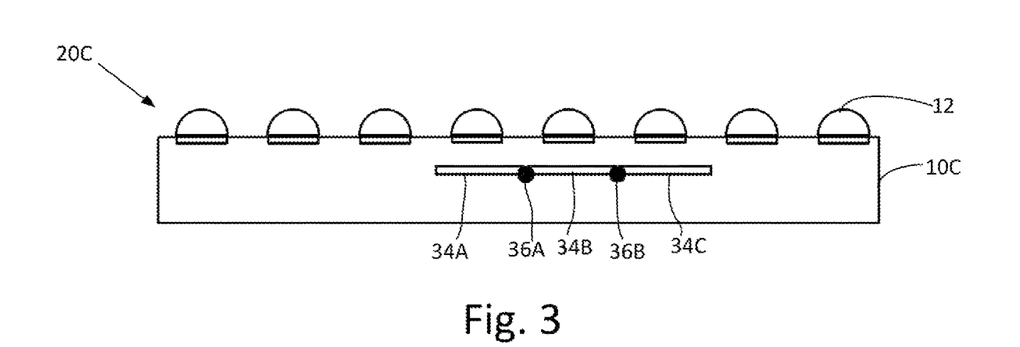
FIG. 3 is a side cross-section view depicting features within an example IC 20C, in accordance with another embodiment of the disclosure.

Referring now to FIG. 3, a side cross-section view depicting features within another example IC 20C is shown, in accordance with another embodiment of the disclosure. While the above-described embodiments provide reduced current-density variation across the width of a thin-film resistor and also provide thermal dissipation through the use of columns of IC terminals (and optionally external PCB conductors) that short the thin-film resistor electrical connections across their widths, it is possible to implement either of the architectures described above with reference to IC 20A of FIG. 1A-1C or with reference to IC 20B of FIGS. 2A-2C using only internal metal shorts. In IC 20C, conductive strips 34A-34C are implemented in an internal metal layer of a die 10C and are not connected to columns of solder balls 12. Thin-film resistor segments 36A and 36B are deposited bridging the gaps between conductive strips 34A and 34B, and between conductive strips 34B and 34C, respectively. If a metal layer of sufficient thickness is available to handle all of the current density associated with the thin-film resistor, which may include electrically bonding multiple internal conductive strips with vias, or if current requirements are sufficiently low, the architecture of IC 20C may provide advantages in that the ability to increase the W/L ratio of a thin-film resistor by combining thin-film segments to achieve a width that is greater than the dimensions of the die or the dimensions of an allocated area of a die.

Figure 4A:
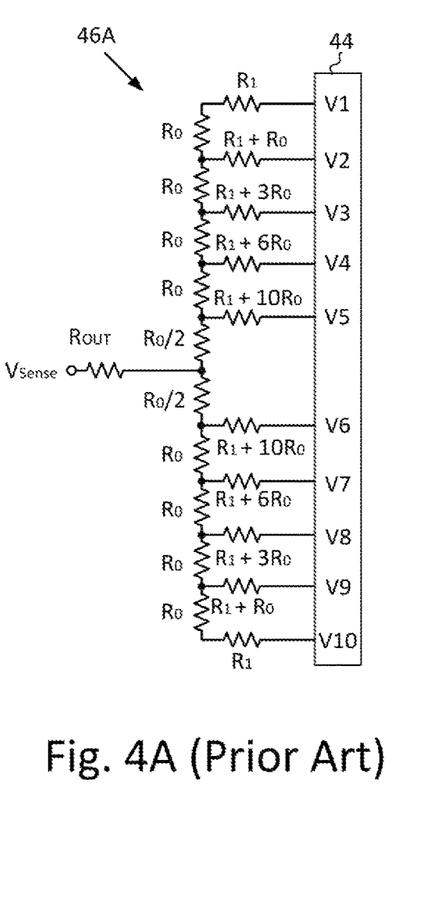
FIG. 4A and FIG. 4B are schematic diagrams depicting prior art compensation network circuits.
Figure 4B:
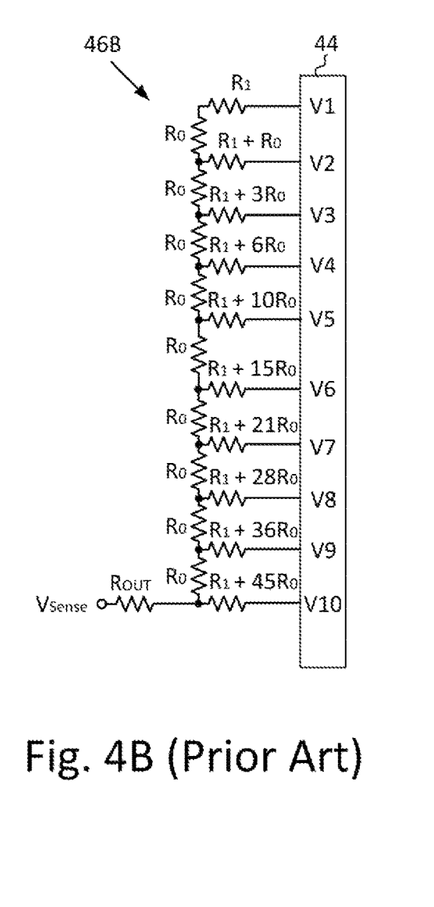

FIG. 4A and FIG. 4B are schematic diagrams depicting prior art compensation network circuits. With existing thin-film resistor implementations, resistive ballasting networks may be used to generate sense voltages as disclosed in U.S. Patent Application Publication US20210364560A1. Resistor ladders having an increasing resistance in the direction of the sense voltage output terminals scale the contribution of voltages at tap points along the conductive strips forming the terminals of the thin-film resistor, so that non-uniformity of the current density in the thin-film resistor, and thus variation in the voltage at the terminals along the width of the thin-film resistor is compensated in the sense terminal output voltages. The resulting implementation provides a four-terminal thin-film resistor, i.e., a thin-film resistor having high-current primary terminals, and a second set of very-low-current terminals used to sense the voltage across the thin-film resistor. A prior art compensated sensing network 46A, which is duplicated for each terminal of the thin-film resistor, is shown in FIG. 4A, along with resistor weightings used for a uniform spacing of tap points that provide voltages V1-V10 along corresponding the thin-film resistor terminal 44. Prior art compensated sensing network 46A, which produces one of the terminal voltages Vsense, may be used when sense terminals are available to locate near the midpoints of the width of the thin-film resistor terminals. Another prior art compensated sensing network 46B as shown in FIG. 4B is used when the sense terminals are located at an end of thin-film resistor terminal 44. Prior art compensated sensing network 46A has a reduced range of resistor weightings (e.g., 11:1) with respect to prior art compensated sensing network 46B, which may be difficult to implement with the range of ballasting resistors required (e.g., 46:1).

Figure 5A:
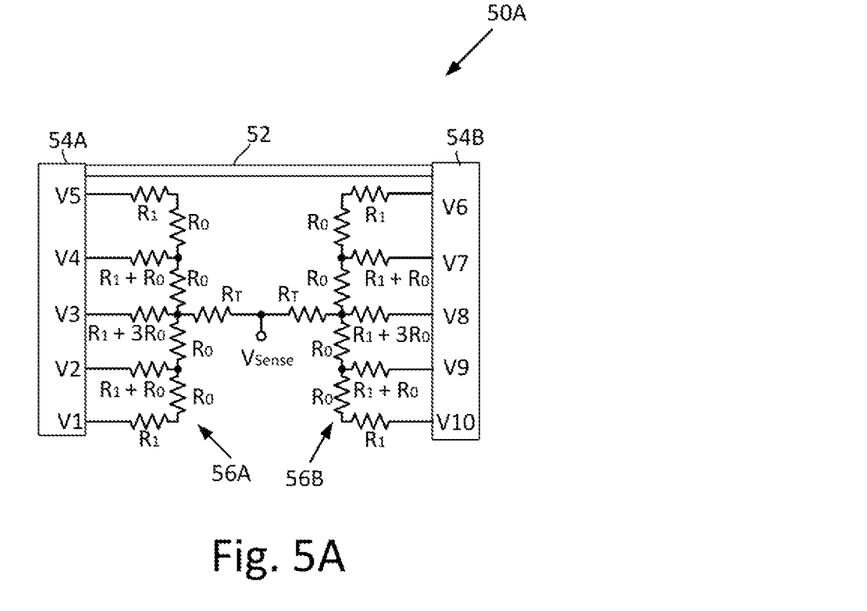
FIG. 5A and FIG. 5B are schematic diagrams depicting compensation network circuits, in accordance with embodiments of the disclosure.
Figure 5B:
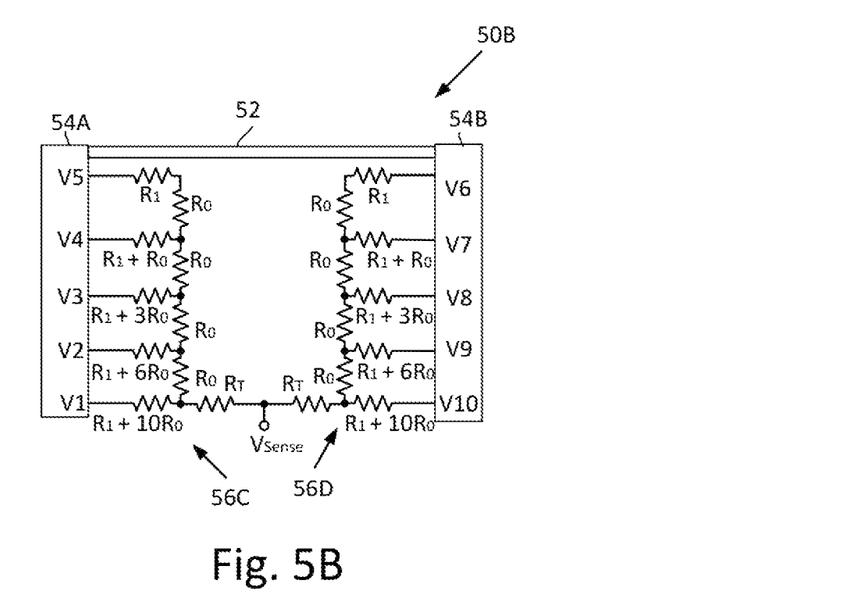

Referring now to FIG. 5A and FIG. 5B, schematic diagrams are shown depicting compensated sensing network circuits 50A and 50B, respectively, in accordance with embodiments of the disclosure. Compensated sensing network circuit 50A is available for use when the corresponding sense terminal may be located near a midpoint of the thin-film resistor terminals, which, with the segmented-width thin-film resistors in the embodiments of the disclosure are described above, is located near the edge of the die where segments of the thin-film resistor terminals provided by conductive strips 54A, 54B are bonded together with conductor 52 to series-connect the thin-film resistor segments. Compensated sensing network circuit 50A is segmented into two sub-circuits 56A, 56B, one for each segment of the thin-film resistor and the entire compensated sensing network circuit 50A is duplicated for each of the terminals of the thin-film resistor. Only one compensated sensing network circuit 50A is shown, as the other circuit will generally be identical. Therefore, the segmented architecture provides a further advantage in allowing for a desirably edge-located sense terminal pair, as well as dramatically reducing the range of resistances required for compensation, e.g., 4:1 as shown. Compensated sensing network circuit 50B may alternatively be used when the sense terminals are located near the opposite edge of the die, i.e., at the ends of the thin-film resistor terminals, with a compromise of an increased range of compensation resistances (e.g., 11:1) required in each of the sub-circuits 56C, 56D in compensated sensing network 50B, which is also duplicated to generate a sense voltage for the opposite polarity sense terminal as described above.

Figure 6A:
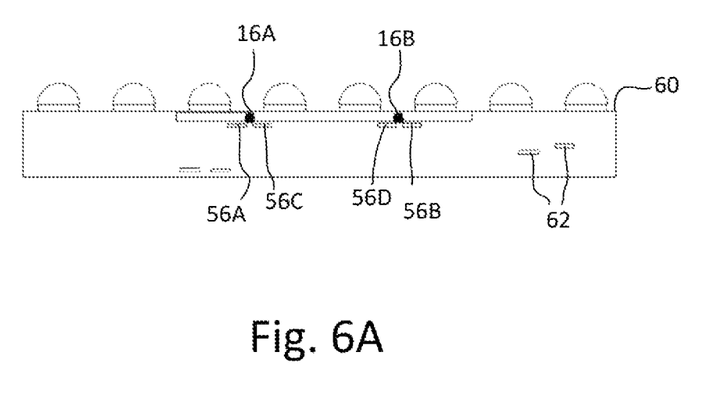
FIG. 6A is a side cross-section view and FIG. 6B is a bottom view depicting features within an example die 60, in accordance with an embodiment of the disclosure.
Figure 6B:
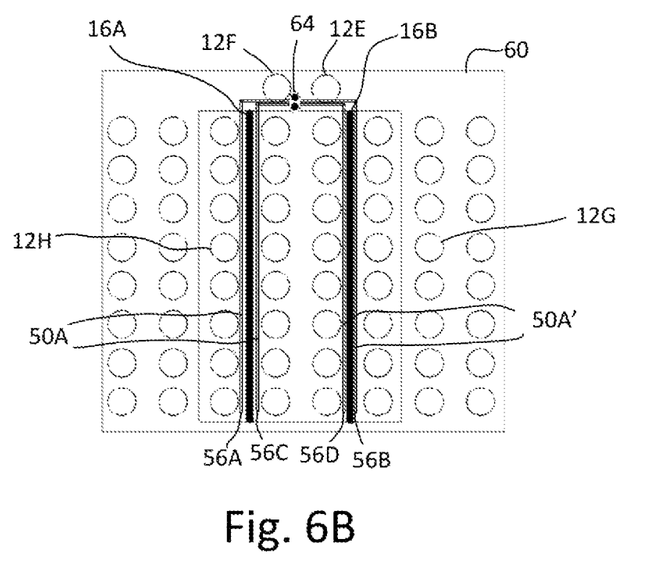

Referring now to FIG. 6A and FIG. 6B, a side cross-section view and a bottom view depicting features within an example die 60 are shown, respectively, in accordance with an embodiment of the disclosure. In addition to thin-film resistor segments 16A, 16B, and associated metal interconnects (terminals), other circuits 62 are integrated on die 60, including sub-circuits 56A, 56B of compensated sensing network 50A and another compensating sensing network 50A', which are distributed along inner and outer "U"-shaped paths, the sides of which are connected together at one edge of example die 60. Compensated sensing network 50A provides an output to a sense terminal 12E and other compensated sensing network 50A' provides the output to a second sense terminal 12F. An ideal location for the sense terminals would be at terminal location 64, but for external sense connections, it may be necessary to extend die 60 to include a row for sense terminals 12E, 12F, or shorten thin-film resistor segments 16A, 16B to provide space for a row that includes the sense terminals. Alternatively, a star routing connection to alternate terminal locations could be used, ideally maintaining symmetry, e.g., at solder balls 12G, 12H.

In summary, this disclosure shows and describes integrated circuits implemented by a die that includes a thin-film sense resistor, and methods of fabrication of the die. The die may include a substrate, a plurality of electronic devices integrated on the substrate and interconnected to form at least a portion of an electronic circuit, a plurality of interconnect lands arranged in a grid for interconnecting the electronic devices with a plurality of external terminals, and a thin-film resistor implemented by at least two thin-film resistor segments that operate in parallel in the electronic circuit. The at least two thin-film resistor segments may be disposed between different pairs of adjacent columns of the grid interconnect lands, a first one of the at least two thin-film resistor segments may be electrically connected along its width to lands of a first column of the grid of interconnect lands, and a second one of the at least two thin-film resistor segments may be electrically connected along its width to lands of a second column of the grid interconnect lands. The methods of fabrication may include forming a plurality of electronic devices on the substrate, interconnecting the electronic devices to form at least a portion of an electronic circuit, forming a plurality of interconnect lands arranged in a grid for interconnecting the electronic devices with a plurality of external terminals, depositing a thin-film resistor implemented by at least two thin-film resistor segments that operate in parallel in the electronic circuit. The at least two thin-film resistor segments may be deposited between different pairs of adjacent columns of the grid interconnect lands. The methods may further include electrically connecting a first one of the at least two thin-film resistor segments along its width to lands of a first column of the grid of interconnect lands, and electrically connecting a second one of the at least two thin-film resistor segments along its width to lands of a second column of the grid interconnect lands.

In some example embodiments, the at least two thin-film resistor segments may extend substantially across the die, so that first ends of the at least two thin-film resistor segments may be located proximate a first edge of the die, and so that second ends of the at least two thin-film resistor segments may be located proximate a second edge of the die opposite the first edge of the die. In some example embodiments a metal interconnect may be disposed on the substrate that interconnects the first ends of the at least two thin-film resistor segments. In some example embodiments, a pair of resistive networks may be integrated on the die and electrically connected to a corresponding one of the at least two thin-film resistor segments. The resistors of the resistive networks may have a first terminal electrically connected to the corresponding thin-film resistor segments at points along a width thereof and a second terminal electrically connected to a common sense node. The resistances of the resistive networks may be scaled to compensate for the position of the electrical connections of the resistors of the resistive network along the width of the corresponding thin-film resistor segments. In some example embodiments, each of the pair of resistive networks may include a first subnetwork electrically connected to the corresponding thin-film resistor segment across a first portion of the width of the corresponding thin-film resistor segment, and a second subnetwork electrically connected to the corresponding thin-film resistor segment across a second portion of the width of the corresponding thin-film resistor segment. The first and second portions of the width of the corresponding thin-film resistor segment may be adjacent and non-overlapping, so that a range of magnitude of the scaling of the resistances of the resistive networks may be reduced.

In some example embodiments, the first one of the at least two thin-film resistor segments may be disposed between a first column and a second column of the grid interconnect lands, the second one of the at least two thin-film resistor segments may be disposed between a third column and a fourth column of the grid interconnect lands, and the second column and the third column may be adjacent. In some example embodiments, the first one of the at least two thin-film resistor segments may be disposed between a first column and a second column of the grid interconnect lands, and the second one of the at least two thin-film resistor segments may be disposed between the second column and a third column of the grid interconnect lands, so that the at least two thin-film resistor segments share a connection to the second column of grid interconnect lands. In some example embodiments, the at least two thin-film resistor segments may have equal resistance. In some example embodiments, the lands may be solder ball lands. In some example embodiments, a resistance of the thin-film resistor may be less than one ohm. In some example embodiments, the thin-film resistor may be formed by a tantalum nitride (TaN) layer.

It should be understood, especially by those having ordinary skill in the art with the benefit of this disclosure, that the various operations described herein, particularly in connection with the figures, may be implemented by other circuitry or structures. The order in which each operation of a given method is performed may be changed, and various elements of the circuits illustrated herein may be added, reordered, combined, omitted, modified, etc. It is intended that this disclosure embrace all such modifications and changes and, accordingly, the above description should be regarded in an illustrative rather than a restrictive sense. Similarly, although this disclosure makes reference to specific embodiments, certain modifications and changes may be made to those embodiments without departing from the scope and coverage of this disclosure. Moreover, any benefits, advantages, or solutions to problems that are described herein with regard to specific embodiments are not intended to be construed as a critical, required, or essential feature or element.

While the disclosure has shown and described particular embodiments of the techniques disclosed herein, it will be understood by those skilled in the art that the foregoing and other changes in form, and details may be made therein without departing from the spirit and scope of the disclosure. For example, the techniques shown above may be applied segmented thin-film resistors in which the metal circuit connected across the width of the resistor is an internal metal layer.

What is claimed is:

1. A die implementing an integrated circuit, comprising:
    a substrate;
    a plurality of electronic devices integrated on the substrate and interconnected to form at least a portion of an electronic circuit;
    a plurality of interconnect lands arranged in a grid for interconnecting the electronic devices with a plurality of external terminals;
    a thin-film resistor implemented by at least two thin-film resistor segments that are coupled in electrical parallel in the electronic circuit, wherein the at least two thin-film resistor segments are disposed between different pairs of adjacent columns of the grid interconnect lands, wherein a first one of the at least two thin-film resistor segments is electrically connected along a width thereof to lands of a first column of the grid of interconnect lands, and wherein a second one of the at least two thin-film resistor segments is electrically connected along a width thereof to lands of a second column of the grid interconnect lands; and
    a pair of resistive networks integrated on the die, wherein the resistive networks are electrically connected to a corresponding one of the at least two thin-film resistor segments, wherein the resistors of the resistive networks have a first terminal electrically connected to the corresponding thin-film resistor segments at points along a width thereof and a second terminal electrically connected to a common sense node, and wherein the resistances of the resistive networks are scaled to compensate for the position of the electrical connections of the resistors of the resistive network along the width of the corresponding thin-film resistor segments.

2. The die of claim 1, wherein the at least two thin-film resistor segments extend substantially across the die, so that first ends of the at least two thin-film resistor segments are located proximate a first edge of the die, and so that second ends of the at least two thin-film resistor segments are located proximate a second edge of the die opposite the first edge of the die.

3. The die of claim 1, further comprising a metal interconnect disposed on the substrate that interconnects the first ends of the at least two thin-film resistor segments.

4. The die of claim 1, wherein each of the pair of resistive networks comprises a first subnetwork electrically connected to the corresponding thin-film resistor segment across a first portion of the width of the corresponding thin-film resistor segment, and a second subnetwork electrically connected to the corresponding thin-film resistor segment across a second portion of the width of the corresponding thin-film resistor segment, wherein the first and second portions of the width of the corresponding thin-film resistor segment are adjacent and non-overlapping, so that a range of magnitude of the scaling of the resistances of the resistive networks may be reduced.

5. The die of claim 1, wherein the first one of the at least two thin-film resistor segments is disposed between the first column and the second column of the grid interconnect lands, wherein the second one of the at least two thin-film resistor segments is disposed between a third column and a fourth column of the grid interconnect lands, and wherein the second column and the third column are adjacent.

6. The die of claim 1, wherein the first one of the at least two thin-film resistor segments is disposed between the first column and the second column of the grid interconnect lands, wherein the second one of the at least two thin-film resistor segments is disposed between the second column and a third column of the grid interconnect lands, whereby the at least two thin-film resistor segments share a connection to the second column of grid interconnect lands.

7. The die of claim 1, wherein the at least two thin-film resistor segments have equal resistance.

8. The die of claim 1, wherein the lands are solder ball lands.

9. The die of claim 1, wherein a resistance of the thin-film resistor is less than one ohm.

10. The die of claim 1, wherein thin-film resistor is formed by a tantalum nitride (TaN) layer.

11. A method of fabricating an integrated circuit, comprising:
forming a plurality of electronic devices on a substrate of the integrated circuit and interconnecting the electronic devices to form at least a portion of an electronic circuit;
forming a plurality of interconnect lands arranged in a grid for interconnecting the electronic devices with a plurality of external terminals;
depositing a thin-film resistor implemented by at least two thin-film resistor segments that are coupled in electrical parallel in the electronic circuit, wherein the at least two thin-film resistor segments are deposited between different pairs of adjacent columns of the grid interconnect lands;
electrically connecting a first one of the at least two thin-film resistor segments along a width thereof to lands of a first column of the grid of interconnect lands;
electrically connecting a second one of the at least two thin-film resistor segments along a width thereof to lands of a second column of the grid interconnect lands; and
forming a pair of resistive networks on a die, wherein the resistive networks are electrically connected to a corresponding one of the at least two thin-film resistor segments, wherein the resistors of the resistive networks have a first terminal electrically connected to the corresponding thin-film resistor segments at points along a width thereof and a second terminal electrically connected to a common sense node, and wherein the resistances of the resistive networks are scaled to compensate for the position of the electrical connections of the resistors of the resistive network along the width of the corresponding thin-film resistor segments.

12. The method of claim 11, wherein the depositing deposits the at least two thin-film resistor segments substantially across the die, so that first ends of the at least two thin-film resistor segments are located proximate a first edge of the die, and so that second ends of the at least two thin-film resistor segments are located proximate a second edge of the die opposite the first edge of the die.

13. The method of claim 11, further comprising forming a metal interconnect on the substrate that interconnects the first ends of the at least two thin-film resistor segments.

14. The method of claim 13, wherein each of the pair of resistive networks comprises a first subnetwork electrically connected to the corresponding thin-film resistor segment across a first portion of the width of the corresponding thin-film resistor segment, and a second subnetwork electrically connected to the corresponding thin-film resistor segment across a second portion of the width of the corresponding thin-film resistor segment, wherein the first and second portions of the width of the corresponding thin-film resistor segment are adjacent and non-overlapping, so that a range of magnitude of the scaling of the resistances of the resistive networks may be reduced.

15. The method of claim 11, wherein the depositing deposits a first one of the at least two thin-film resistor segments between the first column and the second column of the grid interconnect lands, and wherein the depositing deposits the second one of the at least two thin-film resistor segments between a third column and a fourth column of the grid interconnect lands, wherein the second column and the third column are adjacent.

16. The method of claim 11, wherein the depositing deposits the first one of the at least two thin-film resistor segments between the first column and the second column of the grid interconnect lands, and wherein the depositing deposits the second one of the at least two thin-film resistor segments between the second column and a third column of the grid interconnect lands, whereby the at least two thin-film resistor segments share a connection to the second column of grid interconnect lands.

17. The method of claim 11, wherein the at least two thin-film resistor segments have equal resistance.

18. The method of claim 11, wherein the lands are solder ball lands.

19. The method of claim 11, wherein a resistance of the thin-film resistor is less than one ohm.

20. The method of claim 11, wherein depositing deposits a tantalum nitride (TaN) layer to form the thin-film resistor.

* * * * *

UNITED STATES PATENT AND TRADEMARK OFFICE
CERTIFICATE OF CORRECTION

| | | |
|---|---|---|
| PATENT NO. | : 12,379,400 B2 | Page 1 of 1 |
| APPLICATION NO. | : 18/140456 | |
| DATED | : August 5, 2025 | |
| INVENTOR(S) | : Khenkin et al. | |

It is certified that error appears in the above-identified patent and that said Letters Patent is hereby corrected as shown below:

In the Specification

In Column 4, Line 58, delete "FIG. 1A-1C" and insert -- FIGS. 1A-1C --, therefor.

In Column 8, Line 6, delete "applied" and insert -- applied to --, therefor.

Signed and Sealed this
Twenty-eighth Day of October, 2025

John A. Squires
*Director of the United States Patent and Trademark Office*